US012340857B2

(12) United States Patent
Shin et al.

(10) Patent No.: US 12,340,857 B2
(45) Date of Patent: Jun. 24, 2025

(54) ELECTRONIC DEVICE FOR ADJUSTING DRIVING VOLTAGE OF VOLATILE MEMORY AND METHOD FOR OPERATING THE SAME

(71) Applicant: SAMSUNG ELECTRONICS CO., LTD., Suwon-si (KR)

(72) Inventors: Changmi Shin, Suwon-si (KR); Jeyoon Kim, Suwon-si (KR); Seungjin Yang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 337 days.

(21) Appl. No.: 17/979,552

(22) Filed: Nov. 2, 2022

(65) Prior Publication Data

US 2023/0134667 A1 May 4, 2023

Related U.S. Application Data

(63) Continuation of application No. PCT/KR2022/017002, filed on Nov. 2, 2022.

(30) Foreign Application Priority Data

Nov. 2, 2021 (KR) .......... 10-2021-0149100
Nov. 25, 2021 (KR) .......... 10-2021-0164934

(51) Int. Cl.
*G11C 29/12* (2006.01)
*G11C 7/04* (2006.01)

(52) U.S. Cl.
CPC .......... *G11C 29/12005* (2013.01); *G11C 7/04* (2013.01); *G11C 29/12015* (2013.01)

(58) Field of Classification Search
CPC .......... G11C 29/12; G11C 29/12005
(Continued)

(56) References Cited

U.S. PATENT DOCUMENTS 9,865,315 B1 * 1/2018 DeSimone .......... G11C 11/4093
2004/0043783 A1 3/2004 Anderson
(Continued)

FOREIGN PATENT DOCUMENTS

JP 2004-260090 A 9/2004
JP 2008-545120 A 12/2008
(Continued)

OTHER PUBLICATIONS

International Search Report (PCT/ISA/210) issued Jan. 27, 2023 by the International Searching Authority in International Patent Application No. PCT/KR2022/017002.
(Continued)

*Primary Examiner* — Muna A Techane
(74) *Attorney, Agent, or Firm* — Sughrue Mion, PLLC

(57) ABSTRACT

An electronic device includes a power management circuit; a volatile memory; and a processor configured to: based on the electronic device starting system booting, identify whether the system booting is initial booting or whether a condition designated in the volatile memory is satisfied, based on identifying that the system booting is the initial booting or the condition is satisfied, identify a lower positive supply voltage (LVDD) value for the volatile memory by testing an LVDD margin for the volatile memory, and based on the LVDD value being less than a reference LVDD value for the volatile memory, drive the volatile memory using the LVDD value.

16 Claims, 12 Drawing Sheets

(58) Field of Classification Search
USPC .......................................................... 365/201
See application file for complete search history.

(56) References Cited

U.S. PATENT DOCUMENTS

| | | |
|---|---|---|
| 2004/0105292 A1 | 6/2004 | Matsui |
| 2006/0164877 A1* | 7/2006 | Miyamoto ............... G11C 11/22 365/145 |
| 2006/0259840 A1 | 11/2006 | Abadeer et al. |
| 2007/0136536 A1 | 6/2007 | Byun et al. |
| 2009/0016140 A1 | 1/2009 | Qureshi et al. |
| 2013/0271179 A1 | 10/2013 | von Kaenel |
| 2014/0006688 A1* | 1/2014 | Yu ........................ G06F 12/0246 365/185.03 |
| 2014/0063982 A1 | 3/2014 | Mozak et al. |
| 2014/0369147 A1 | 12/2014 | Mera et al. |
| 2015/0294723 A1 | 10/2015 | Choi et al. |
| 2016/0111164 A1* | 4/2016 | Chen ................... G11C 16/0483 365/185.11 |
| 2016/0320831 A1* | 11/2016 | McCubbin ............ G06F 1/3296 |
| 2016/0357234 A1 | 12/2016 | Luo et al. |
| 2019/0033956 A1 | 1/2019 | Tsao et al. |
| 2019/0115053 A1 | 4/2019 | Park et al. |
| 2019/0156882 A1 | 5/2019 | Kihara |
| 2019/0172510 A1 | 6/2019 | Kim et al. |

FOREIGN PATENT DOCUMENTS

| | | |
|---|---|---|
| JP | 5462160 B2 | 4/2014 |
| JP | 2019-96371 A | 6/2019 |
| KR | 10-0158132 B1 | 12/1998 |
| KR | 10-2004-0018215 A | 3/2004 |
| KR | 10-2007-0059462 A | 6/2007 |
| KR | 10-2008-0080695 A | 9/2008 |
| KR | 10-2012-0037023 A | 4/2012 |
| KR | 10-2019-0041645 A | 4/2019 |
| KR | 10-2019-0066500 A | 6/2019 |

OTHER PUBLICATIONS

Written Opinion (PCT/ISA/237) issued Jan. 27, 2023 by the International Searching Authority in International Patent Application No. PCT/KR2022/017002.
Communication issued Oct. 22, 2024 by the European Patent Office in European Patent Application No. 22890356.3.

* cited by examiner

ELECTRONIC DEVICE FOR ADJUSTING DRIVING VOLTAGE OF VOLATILE MEMORY AND METHOD FOR OPERATING THE SAME

CROSS REFERENCE TO RELATED APPLICATIONS

This application is a bypass continuation of International Patent Application No. PCT/KR2022/017002, filed on Nov. 2, 2022, which is based on and claims priority to Korean Patent Application No. 10-2021-0149100, filed on Nov. 2, 2021, in the Korean Intellectual Property Office, and Korean Patent Application No. 10-2021-0164934, filed on Nov. 25, 2021, in the Korean Intellectual Property Office, the disclosures of which are incorporated by reference herein in their entireties.

BACKGROUND

1. Field

The disclosure relates to an electronic device for adjusting the driving voltage of a volatile memory and an operation method thereof.

2. Description of Related Art

With the development of electronic technology, various types of electronic devices have been developed and distributed. Particularly, recently, portable electronic devices having various functions, such as smartphones, tablet PCs, and the like, are being increasingly developed and distributed. With the dissemination of portable electronic devices, technology applied to electronic devices has been advanced and the degree of integration of components of an electronic device has been increased.

When the degree of integration of components of an electronic device is increased, a voltage margin between an application processor (AP) and a volatile memory (e.g., dynamic random access memory (DRAM)) included in the electronic device may become vulnerable. In addition, with reference to process spread indicating a magnitude of changes in quality of electronic devices produced in the same process, voltage characteristics of electronic devices may be different from each other. Accordingly, in the case in which a setting associated with the same voltage value is applied to all electronic devices of the same type, the power efficiency of an individual electronic device may deteriorate.

Generally, a drain voltage (VDD) provided to a volatile memory may be a voltage that enables a current to flow normally in a field effect transistor (FET) included in the volatile memory. A lower positive supply voltage (LVDD or LVCC) may be a voltage that enables a volatile memory to stably perform a normal operation by maximally decreasing a VDD value.

In the related art, an electronic device may be incapable of testing a lower positive supply voltage (LVDD) margin or may be incapable of adjusting an LVDD value with respect to the LVDD for a volatile memory that is set in the process of developing and processing a product. For example, an electronic device is capable of testing an LVDD margin only in the process of developing and processing a product and thus, it is necessary to operate a volatile memory by using a reference LVDD determined during the corresponding process. That is, the electronic device may operate a volatile memory using a VDD value (e.g., an LVDD value) indiscriminately set for the same type of electronic devices.

In this instance, due to process spread, the characteristics related to the VDDs of respective electronic devices may be different from each other. Accordingly, the electronic device is incapable of driving a volatile memory using a VDD value to which the characteristic of an individual electronic device is applied. Since the electronic device is incapable of driving the volatile memory using the VDD value to which the characteristic of an individual electronic device is applied, the power efficiency of driving the volatile memory may deteriorate.

SUMMARY

According to one or more embodiments of the disclosure, there may be provided an electronic device and an operation method thereof, which may test an LVDD margin for a volatile memory according to a designated condition when the electronic device performs booting, may drive, based on a test result, the volatile memory using a new LVDD appropriate for the electronic device, instead of using a reference LVDD value. According to an aspect of the disclosure, an electronic device includes: a power management circuit; a volatile memory; and a processor configured to: based on the electronic device starting system booting, identify whether the system booting is initial booting or whether a condition designated in the volatile memory is satisfied, based on identifying that the system booting is the initial booting or the condition is satisfied, identify a lower positive supply voltage (LVDD) value for the volatile memory by testing an LVDD margin for the volatile memory, and based on the LVDD value being less than a reference LVDD value for the volatile memory, drive the volatile memory using the LVDD value.

According to an aspect of the disclosure, a method of operating an electronic device, includes: based on the electronic device starting system booting, identifying whether the system booting is initial booting or whether a condition designated in a volatile memory included in the electronic device is satisfied; based on identifying that the system booting is the initial booting or the condition is satisfied, identifying a lower positive supply voltage (LVDD) value for the volatile memory by testing an LVDD margin for the volatile memory; and based on the LVDD value being less than a reference LVDD value for the volatile memory, driving the volatile memory using the LVDD value.

According to an aspect of the disclosure, a non-transitory computer-readable recording medium stores a program that is executed by a processor of an electronic device to perform a method including: based on the electronic device starting system booting, identifying whether the system booting is initial booting or whether a condition designated in a volatile memory included in the electronic device is satisfied; based on identifying that the system booting is the initial booting or the condition is satisfied, identifying a lower positive supply voltage (LVDD) value for the volatile memory by testing an LVDD margin for the volatile memory; and based on the LVDD value being less than a reference LVDD value for the volatile memory, driving the volatile memory using the LVDD value. An electronic device according to one or more embodiments may increase the efficiency of the power of the electronic device by driving a volatile memory using an LVDD appropriate for the characteristic of the electronic device.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
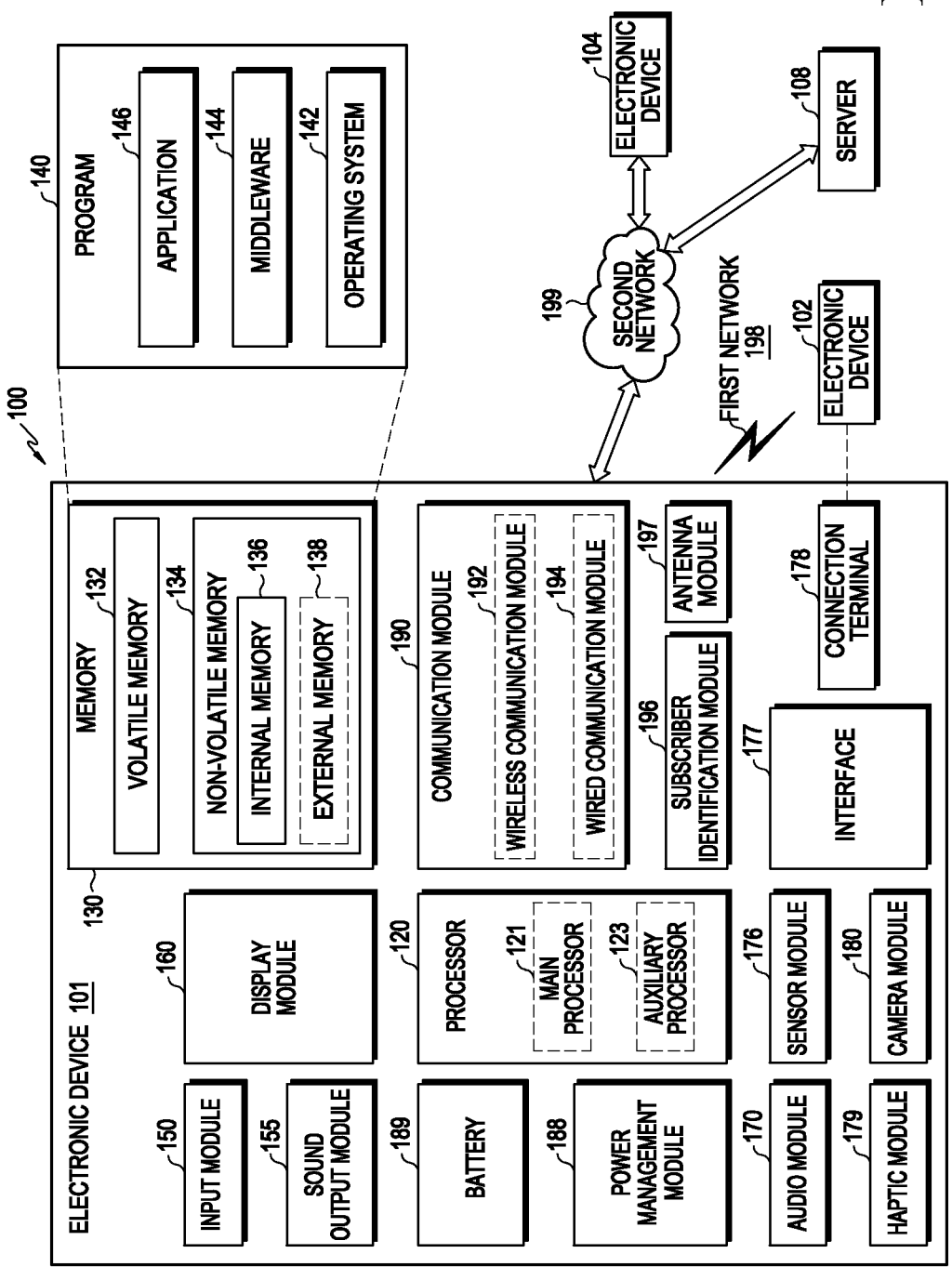
FIG. 1 is a block diagram illustrating an electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence model is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna.

The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing 1eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the external electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
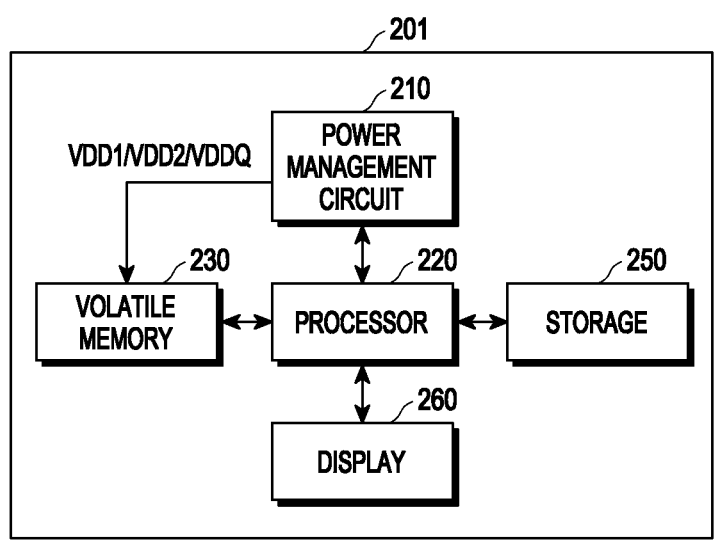
FIG. 2 is a block diagram schematically illustrating an electronic device according to various embodiments.

FIG. 2 is a block diagram schematically illustrating an electronic device according to various embodiments.

Referring to FIG. 2, according to various embodiments, the electronic device 201 may include a power management circuit 210, a processor 220, a volatile memory 230, a storage 250, and a display 260. For example, the electronic device 201 may be embodied as the electronic device 101 of FIG. 1. For example, the electronic device 201 may include a mobile device.

According to various embodiments, the processor 220 may control the overall operation of the electronic device 201. For example, the processor 220 may be embodied as an application processor.

According to various embodiments, the power management circuit 210 may provide power to elements included in the electronic device 201 according to control performed by the processor 220. For example, the power management circuit 210 may be embodied to be identical or similar to the power management module 188 of FIG. 1. For example, the power management circuit 210 may include a power management integrated circuit (PMIC).

According to various embodiments, according to control performed by the processor 220, the power management circuit 210 may provide a first voltage (VDD1), a second voltage (VDD2), and a third voltage (VDDQ) to the volatile memory 230 (e.g., the volatile memory 132 of FIG. 1). For example, the power management circuit (e.g., a PMIC) may provide three types of voltages (VDD1, VDD2, and VDDQ) to the volatile memory 230 (e.g., a dynamic random access memory (DRAM)) for smooth communication with the processor 220 (e.g., an application processor (AP)). For example, the first voltage (VDD1) may be power for driving a word line of the volatile memory 230. The second voltage (VDD2) may be power for driving the other circuits of the volatile memory 230. The third voltage (VDDQ) may be power used for data transmission between the processor and the volatile memory 230.

According to various embodiments, the processor 220 may adjust the LVDD value of the second voltage (VDD2) that the power management circuit 210 provides to the volatile memory 230. For example, the LVDD may be the lowest VDD value needed for the volatile memory 230 to normally operate. For example, the processor 220 may adjust the LVDD value of the second voltage (VDD2) by testing the LVDD margin of the second voltage (VDD2). For example, the processor 220 may adjust the LVDD value to be higher or lower than a reference LVDD. Alternatively, the processor 220 may maintain the reference LVDD value as the LVDD value. For example, the reference LVDD may be a previously set LVDD value of the second voltage (VDD2) in the process of developing and processing a product.

According to various embodiments, the processor 220 may boot up the system of the electronic device 201. The processor 220 may identify whether system booting is initial booting when performing the system booting of the electronic device 201. For example, initial booting may be booting initially performed after the electronic device 201 is released. In the case in which the system booting is not initial booting, the processor 220 may identify whether a condition designated in the volatile memory 230 is satisfied. For example, in the case in which a designated period of time elapses after previous identification of an LVDD value, the processor 220 may determine that the designated condition is satisfied. For example, the designated period of time may be set automatically by the processor 220, or may be set by a user.

According to various embodiments, in the case in which system booting is initial booting or a condition designated in the volatile memory 230 is satisfied, the processor 220 may test a lower positive supply voltage (LVDD) margin for the volatile memory 230. The processor 220 may identify the LVDD value for the volatile memory 230 by testing an LVDD margin. For example, the processor 220 may test an LVDD margin by identifying whether the volatile memory 230 operates stably and normally when a set LVDD value is provided to the volatile memory 230. For example, the processor 220 may test whether the volatile memory 230 operates stably and normally by increasing or decreasing the set LVDD value by a designated voltage. For example, the processor 220 may determine, based on a result of testing the LVDD margin, a test pass or a test failure. The processor 220 may identify the lowest VDD value among test-passed VDD values as the LVDD value. For example, the operation of testing the LVDD margin may include an operation of increasing or decreasing the LVDD value, an operation of providing the increased or decreased LVDD value to the volatile memory 230, an operation of determining, based on the provided LVDD value, whether the volatile memory 230 stably and normally shows performance greater than or equal to a reference value, and an operation of outputting a determination result (e.g., a test pass or a test failure).

According to various embodiments, in the case in which the identified LVDD value is less than the reference LVDD value for the volatile memory 230, the processor 220 may drive the volatile memory 230 using the identified LVDD value. For example, in the case in which the identified LVDD value is less than the reference LVDD value for the volatile memory 230, the processor 220 may control the power management circuit 210 so as to provide the LVDD value to the volatile memory 230 as the LVDD voltage of the second voltage (VDD2).

According to various embodiments, in the case in which the identified LVDD value is not less than the reference LVDD value for the volatile memory 230, the processor 220 may drive the volatile memory 230 using the identified LVDD value under a predetermined condition. For example, in the case in which the identified LVDD value is not less than the reference LVDD for the volatile memory 230, and system booting is initial booting, the processor 220 may determine that the electronic device (e.g., the processor 220 or the volatile memory 230) is defective. Alternatively, in the case in which the identified LVDD value is not less than the reference LVDD for the volatile memory 230, and system booting is not initial booting, if the identified LVDD value is less than a threshold voltage value, the processor 220 may drive the volatile memory 230 using the identified LVDD value. Through the above, the processor 220 may decrease the amount of power consumed by driving the volatile memory 230.

According to various embodiments, in the case in which system booting is not initial booting and a condition designated in the volatile memory 230 is not satisfied, the processor 220 may drive the volatile memory 230 using the reference LVDD. Alternatively, in the case in which the identified LVDD value is identical to the reference LVDD value for the volatile memory 230, the processor 220 may drive the volatile memory 230 using the reference LVDD.

According to various embodiments, the processor 220 may include a temperature sensor (not illustrated). For example, the processor 220 may identify the temperature of at least one of the processor 220 or the volatile memory 230 using a temperature sensor. In the case in which the identified temperature is within a designated temperature range (e.g., a normal temperature range (e.g., greater than or equal to 10 degrees Celsius and less than or equal to 50 degrees Celsius), the processor 220 may identify an LVDD value for the volatile memory.

According to various embodiments, the LVDD margin of the volatile memory 230 is sensitive to a change in temperature, and thus, in the case in which the identified temperature is beyond the designated temperature range (e.g., the normal temperature range (e.g., greater than or equal to 10 degrees Celsius and less than or equal to 50 degrees Celsius)), the accuracy of a test may be decreased. Accordingly, in the case in which the identified temperature is not within the designated temperature range, the processor 220 may not test an LVDD margin for the volatile memory 230. In addition, the processor 220 may not identify an LVDD value for the volatile memory 230.

According to various embodiments, the storage 250 may store data of the electronic device 201. For example, the storage 250 may be embodied as a non-volatile memory (e.g., the non-volatile memory 134 of FIG. 1) or a data storage device. For example, the processor 220 may store, in the storage 250, information associated with a condition designated for identifying the LVDD value of the volatile memory 230 (or a condition for testing the margin of the LVDD of the volatile memory 230). For example, the information associated with the designated condition may include information indicating whether the system booting is initial booting and/or information associated with a flag value. For example, in the case in which a designated period of time elapses after the processor 220 tests the margin of the LVDD, the processor 220 may set the flag value to 1. Alternatively, in the case in which the designated period of time does not elapse after the processor 220 tests the margin of the LVDD, the processor 220 may set the flag value to 0. For example, the processor 220 may store, in the storage 250, a flag value (e.g., Flag=1 or Flag=0) indicating whether the designated condition is satisfied.

According to various embodiments, the processor 220 may display information associated with an LVDD margin test on the display 260 (e.g., the display module 160 of FIG. 1), before testing the LVDD margin of the volatile memory 230. In addition, the processor 220 may also display information associated with an operation of adjusting the LVDD of the volatile memory 230 on the display 260. Based on a result of testing the LVDD margin, the processor 220 may display a screen indicating the defect of the electronic device 201 on the display 260.

Figure 3:
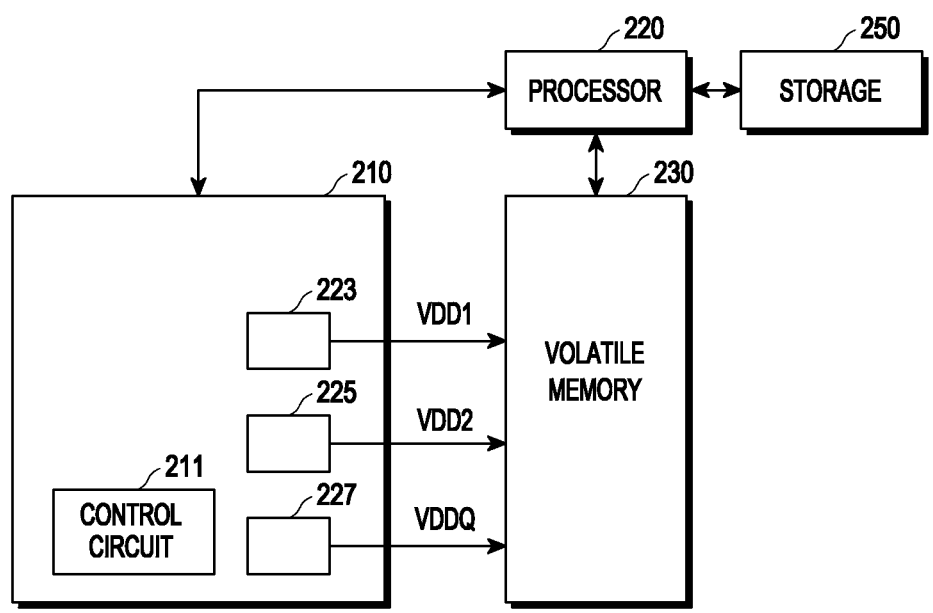
FIG. 3 is a block diagram illustrating an operation of providing a voltage to a volatile memory via a power management circuit, performed by a processor according to various embodiments.

FIG. 3 is a block diagram illustrating an operation of providing a voltage to a volatile memory via a power management circuit, performed by a processor according to various embodiments.

Referring to FIG. 3, according to various embodiments, the power management circuit 210 may include a control circuit 211, a first interface 223, a second interface 225, and a third interface 227. The control circuit 211 may control the overall operation of the power management circuit 210. The control circuit 211 may provide the power of a first voltage (VDD1) to the volatile memory 230 via the first interface 223, may provide the power of a second voltage (VDD2) to the volatile memory 230 via the second interface 225, and may provide the power of a third voltage (VDDQ) to the volatile memory 230 via the third interface 227. For example, the second voltage (VDD2) may be set to be higher than the minimum voltage value needed for stably and normally operating the volatile memory 230. In addition, the second voltage (VDD2) may be set to be lower than a designated threshold voltage value.

According to various embodiments, the processor 220 may identify the minimum voltage (hereinafter, an LVDD) of the second voltage (VDD2) needed for stably and normally operating the volatile memory 230. For example, the processor 220 may test the LVDD margin of the second voltage (VDD2), and may identify the LVDD of the second voltage (VDD2) provided to the volatile memory 230 based on a test result. For example, when performing system booting, the processor 220 may identify the LVDD of the second voltage (VDD2) provided to the volatile memory 230 by testing the LVDD margin of the second voltage (VDD2), and may set the identified LVDD as the minimum voltage of the second voltage (VDD2).

According to various embodiments, the processor 220 may store information associated with the identified LVDD in the storage 250. Subsequently, when performing system booting, the processor 220 may set, based on the information associated with the LVDD stored in the storage 250, the LVDD of the second voltage (VDD2).

According to various embodiments, when performing system booting, the processor 220 may be configured to identify whether the system booting is initial booting or a condition designated in the volatile memory 230 included in the electronic device 201 is satisfied, to identify the LVDD value for the volatile memory 230 by testing the lower positive supply voltage (LVDD) margin for the volatile memory in the case in which the system booting is initial booting or the designated condition is satisfied, and to drive the volatile memory 230 using the LVDD value in the case in which the LVDD value is less than a reference LVDD value for the volatile memory 230. For example, the processor 220 may be embodied as a single chip set (e.g., an application processor).

At least part of the operations of the electronic device 201 described below may be performed by the processor 220. Hereinafter, however, for ease of description, it will be illustrated that the electronic device 201 performs operations.

Figure 4A:
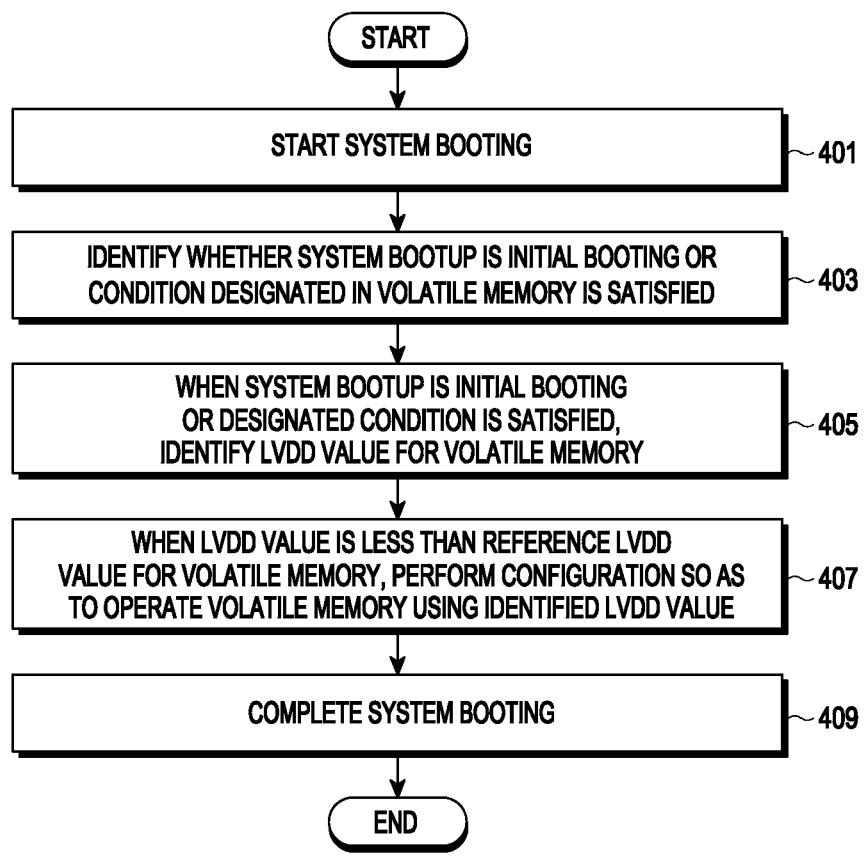
FIG. 4A is a flowchart illustrating an operation of adjusting a voltage for driving a volatile memory when an electronic device performs booting according to various embodiments.

FIG. 4A is a flowchart illustrating an operation of adjusting a voltage for driving a volatile memory when an electronic device performs booting according to various embodiments.

Referring to FIG. 4A, according to various embodiments, in operation 401, the electronic device 201 may start system booting.

According to various embodiments, in operation 403, the electronic device 201 may identify whether the system booting is initial booting or a condition designated in the volatile memory 230 is satisfied.

According to various embodiments, in operation 405, the electronic device 201 may identify whether the system booting is initial booting or a designated condition is satisfied, the electronic device 201 may identify an LVDD value for the volatile memory 230. For example, the electronic device 201 may test the margin of a reference LVDD (or a previously set LVDD), and may identify an LVDD value based on a test result.

According to various embodiments, in operation 407, in the case in which the LVDD value is less than the reference LVDD value (or the previously set LVDD value) for the volatile memory 230, the electronic device 201 may control the power management circuit 210 so as to drive the volatile memory 230 using the identified LVDD value. For example, the electronic device 201 may set the identified LVDD as the minimum voltage of the second voltage (VDD2) that the power management circuit 210 provides to the volatile memory 230.

According to various embodiments, in operation 409, the electronic device 201 may perform the remaining booting operations so as to complete the system booting. Subsequently, the electronic device 201 may operate the volatile memory 230 by setting the minimum voltage of the second voltage (VDD2) to the identified LVDD.

Figure 4B:
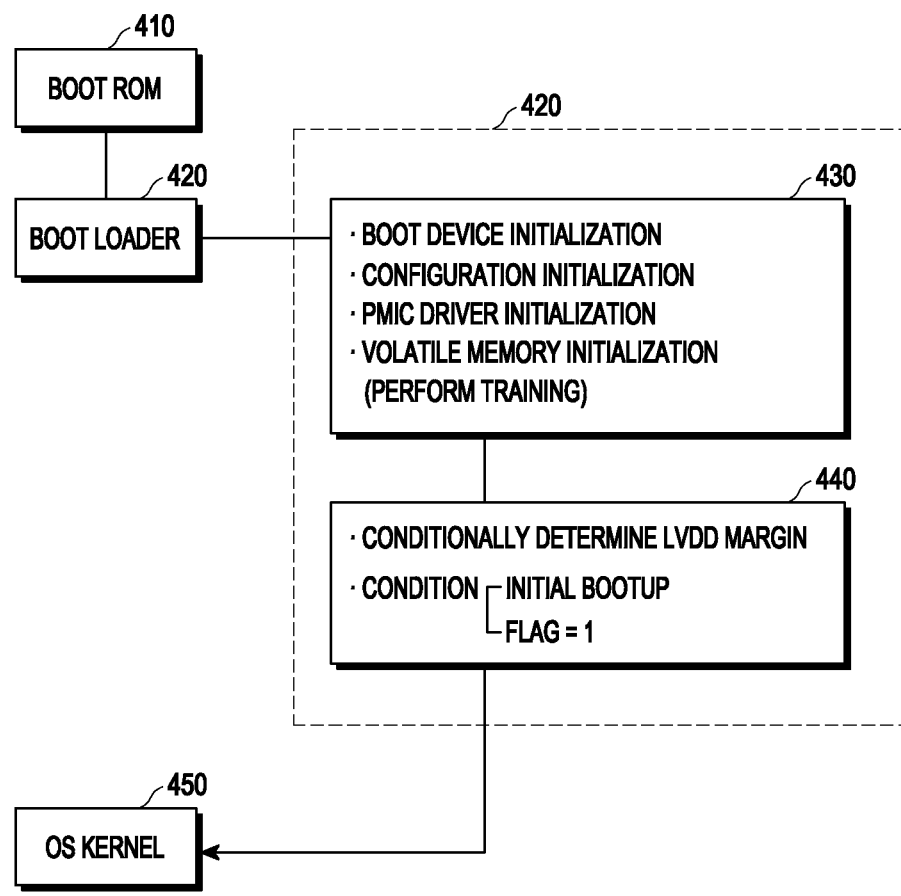
FIG. 4B is a diagram illustrating an operation of adjusting a voltage for driving a volatile memory, performed by an electronic device according to various embodiments.

FIG. 4B is a diagram illustrating an operation of adjusting a voltage for driving a volatile memory, performed by an electronic device according to various embodiments.

Referring to FIG. 4B, according to various embodiments, the electronic device 201 may perform system booting. For example, system booting may include a boot ROM step 410, a boot loader step 420, and an OS kernel step 450. The electronic device 201 may perform boot ROM step 410 and may perform boot loader step 420. For example, the boot loader step 420 may include an initial step 430 and an LVDD identification step 440. For example, the initial step 430 may include a boot device initialization step, a configuration initialization step, a PMIC driver initialization step, and a volatile memory initialization step. For example, the volatile memory initialization may further include a volatile memory training step.

According to various embodiments, after the volatile memory training step (or after the volatile memory initialization step in the case in which volatile memory training is not performed), the electronic device 201 may perform the LVDD identification step 440. For example, after the volatile memory training step, the electronic device may determine (or test) an LVDD margin in the case in which a designated condition is satisfied. For example, the designated condition may include whether the system booting is initial booting and/or whether a flag value is 1.

According to various embodiments, based on a result of determining (or testing) the LVDD margin, the electronic device 201 may newly set the LVDD value of the volatile memory 230 (or the second voltage (VDD2) of the volatile memory 230). Subsequently, the electronic device 201 may perform the remaining booting steps (e.g., the OS kernel step 450), and may complete the system booting.

Figure 5:
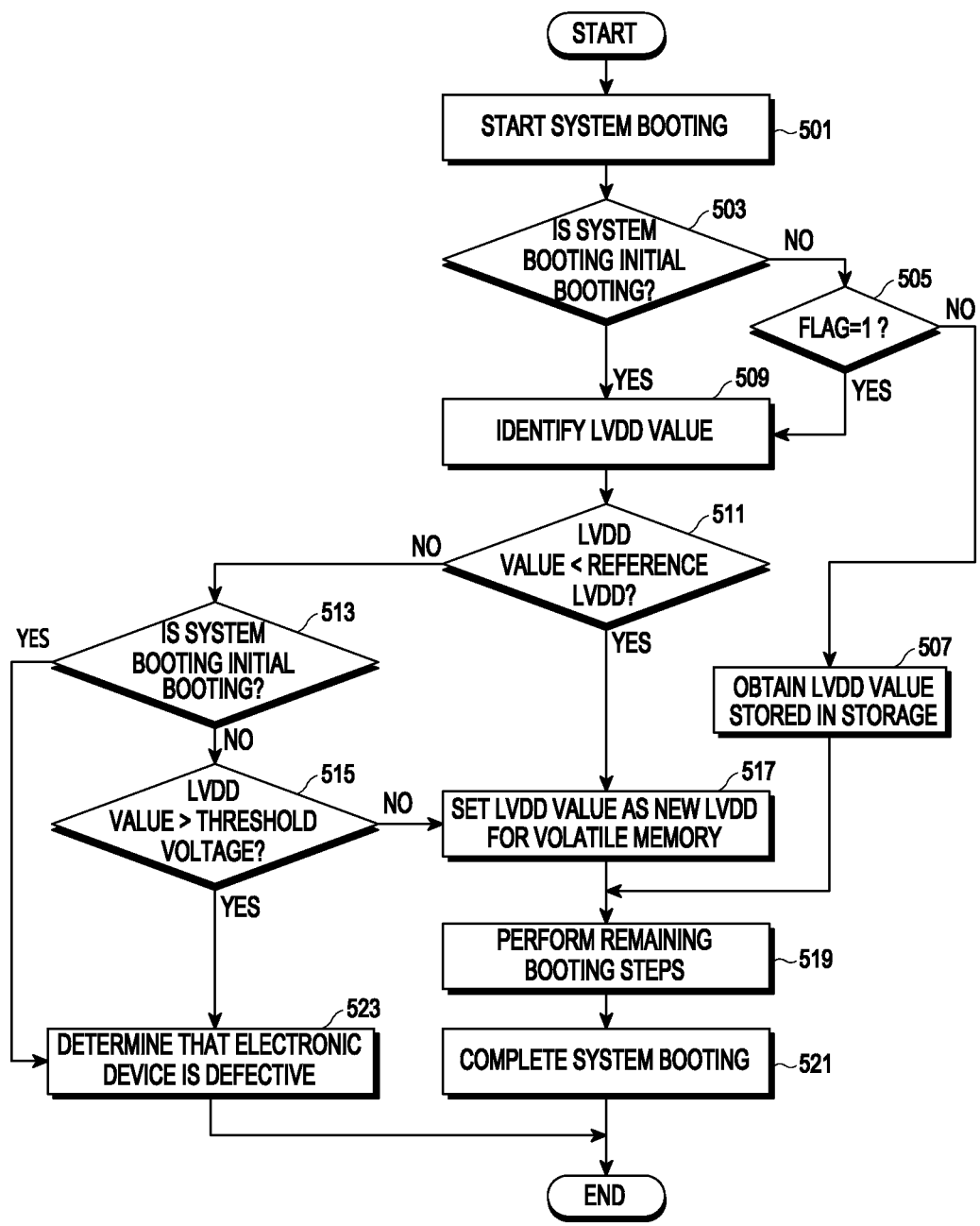
FIG. 5 is a flowchart illustrating an operation of adjusting a voltage for driving a volatile memory when an electronic device performs booting according to various embodiments.

FIG. 5 is a flowchart illustrating an operation of adjusting a voltage for driving a volatile memory when an electronic device performs booting according to various embodiments.

Referring to FIG. 5, according to various embodiments, in operation 501, the electronic device 201 may start system booting.

According to various embodiments, in operation 503, the electronic device 201 may identify whether the system booting is initial booting. For example, initial booting may be booting initially performed after the electronic device 201 is released.

According to various embodiments, if the system booting is not initial booting (No in operation 503), the electronic device 201 may identify a flag value stored in the storage 250 in operation 505. For example, the electronic device 201 may identify whether the flag value stored in the storage 250 is 1. For example, in the case in which a designated period of time elapses after previous identification of an LVDD value, the electronic device 201 may set the flag value to 1. Alternately, in the case in which the designated period of time does not elapse after previous identification of an LVDD value, the electronic device 201 may set the flag value to 0.

According to various embodiments, in the case in which the flag value is not 1 (No in operation 505), the electronic device 201 may obtain an LVDD value for the volatile memory 230 that is stored in the storage 250 in operation 507. In addition, the electronic device 201 may control the power management circuit 210 so as to drive the volatile memory 230 based on the obtained LVDD. In this instance, the electronic device 201 may not test the LVDD margin set in the volatile memory 230. In operation 519, the electronic device 201 may perform the remaining booting operations. In operation 521, the electronic device 201 may complete system booting.

According to various embodiments, if the system booting is initial booting (Yes in operation 503) or a condition designated in the volatile memory 230 is satisfied (Yes in operation 505), the electronic device 201 may identify the LVDD value for the volatile memory 230 in operation 509. For example, the electronic device 201 may test the margin of an LVDD (e.g., a reference LVDD) set in the volatile memory 230, and may identify an LVDD value appropriate for the characteristic of the volatile memory 230 based on a result of the test.

According to various embodiments, in operation 511, the electronic device 201 may compare the identified LVDD value and the reference LVDD, and may identify whether the identified LVDD value is less than the reference LVDD. For example, the reference LVDD may be the minimum voltage value of a second voltage (VDD2) previously set in the volatile memory 230.

According to various embodiments, if it is identified that the identified LVDD value is less than the reference LVDD (Yes in operation 511), the electronic device 201 may set the identified LVDD value as a new LVDD value for the volatile memory 230 (or the second voltage (VDD2) of the volatile memory 230) in operation 517. In addition, the electronic device 201 may control, based on the newly set LVDD, the power management circuit 210 so as to drive the volatile memory 230. In operation 519, the electronic device 201 may perform the remaining booting operations. In operation 521, the electronic device 201 may complete system booting.

According to various embodiments, if it is identified that the identified LVDD value is not less than the reference LVDD (No in operation 511), the electronic device 201 may identify whether the corresponding system booting is initial booting in operation 513. For example, if it is identified that the system booting is initial booting in operation 503, the electronic device 201 may omit operation 513.

According to various embodiments, in the case in which the identified LVDD value is not less than the reference LVDD (No in operation 511) and the system booting is not initial booting (No in operation 513), the electronic device 201 may compare the identified LVDD value and a threshold value, and may identify whether the identified LVDD value is greater than the threshold value in operation 515.

According to various embodiments, if it is identified that the identified LVDD value is not less than the threshold value (No in operation 515), the electronic device 201 may set the identified LVDD value as a new LVDD value for the volatile memory 230 (or the second voltage (VDD2) of the volatile memory 230) in operation 517. In addition, the electronic device 201 may control, based on the newly set LVDD, the power management circuit 210 so as to drive the volatile memory 230. In operation 519, the electronic device 201 may perform the remaining booting operations. In operation 521, the electronic device 201 may complete system booting.

According to various embodiments, if it is identified that the identified LVDD value is greater than the threshold voltage (Yes in operation 515), the electronic device 201 may determine that the electronic device 201 (or the processor 220 and the volatile memory 230) is defective in operation 523. The electronic device 201 may display information indicating that the electronic device 201 is defective via the display 260.

According to various embodiments, if it is identified that the identified LVDD value is not less than the reference LVDD (No in operation 511), and the system booting is initial booting (Yes in operation 513), the electronic device 201 may determine that the electronic device 201 (or the processor 220 and the volatile memory 230) is defective in operation 523. The electronic device 201 may display information indicating that the electronic device 201 is defective via the display 260.

Figure 6:
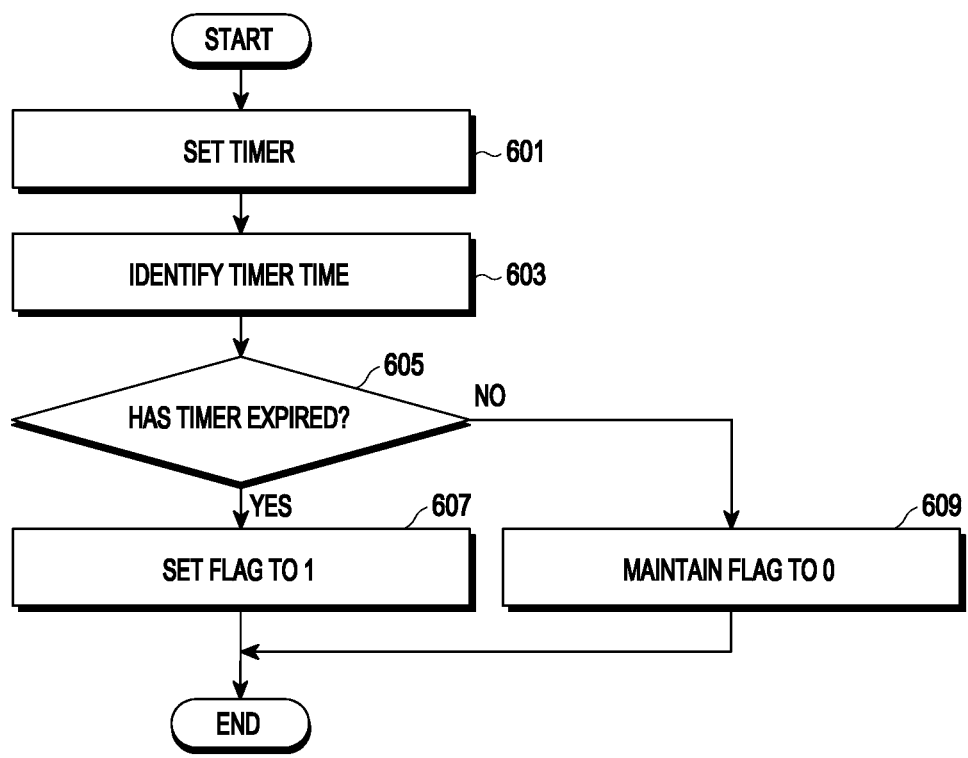
FIG. 6 is a flowchart illustrating an operation of setting a timer for adjusting a voltage for driving a volatile memory, performed by an electronic device according to various embodiments.

FIG. 6 is a flowchart illustrating an operation of setting a timer for adjusting a voltage for driving a volatile memory, performed by an electronic device according to various embodiments.

According to various embodiments, the electronic device 201 may determine, based on a flag value, whether to test the margin of an LVDD.

Referring to FIG. 6, according to various embodiments, in operation 601, the electronic device 201 may set a timer for changing the flag value. For example, the period of time designated in a timer may be set automatically by the processor 220, or may be set by a user. For example, the period of time designated in the timer may be set to 6 months or a year. The electronic device 201 may set the timer based on the point in time at which the LVDD value was identified previously.

According to various embodiments, in operation 603, the electronic device 201 may periodically or aperiodically identify a timer time. In operation 605, the electronic device 201 may identify whether the period of time designated in the timer has expired.

According to various embodiments, if it is identified that the designated period of time has expired (Yes in operation 605), the electronic device 201 may set the flag value to 1, and may store 1 in the storage 250 as the flag value. Subsequently, the electronic device 201 may identify an LVDD, and may set the flag value to 0, and may store the flag value that is set to 0 in the storage 250. When the system booting that is not initial booting is performed, the electronic device 201 may test the margin of the LVDD in the case in which the flag value is identified as 1.

According to various embodiments, if it is identified that the designated period of time has not expired (No in operation 605), the electronic device 201 may maintain the flag value as 0. When the system booting that is not initial booting is performed, the electronic device 201 may not test the margin of the LVDD in the case in which the flag value is identified as 0.

Figure 7:
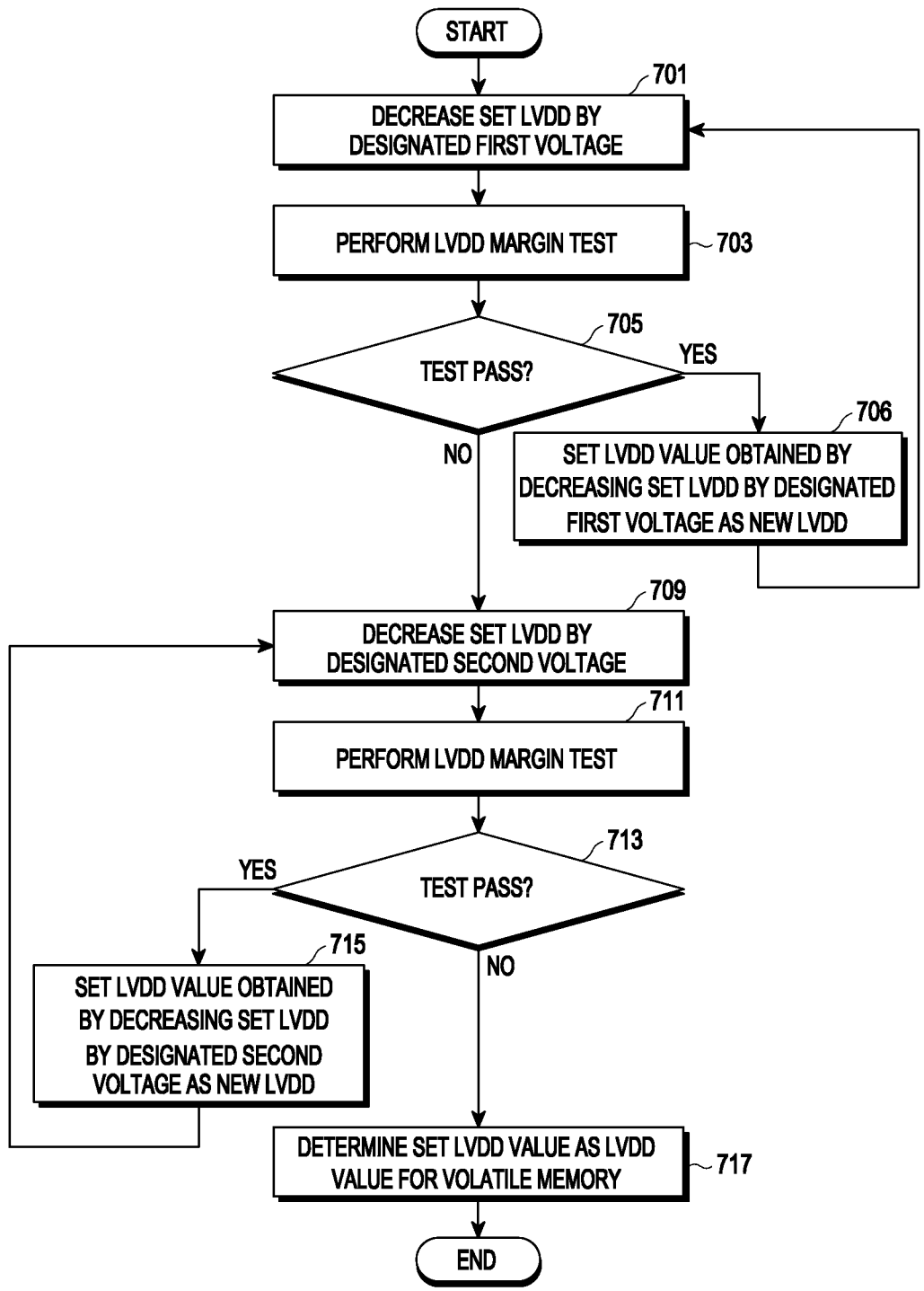
FIG. 7 is a flowchart illustrating an operation of identifying an LVDD value for a volatile memory by performing an LVDD margin test, performed by an electronic device according to various embodiments.

FIG. 7 is a flowchart illustrating an operation of identifying an LVDD value for a volatile memory by performing an LVDD margin test, performed by an electronic device according to various embodiments.

According to various embodiments, the electronic device 201 may test the margin of an LVDD set in the volatile memory 230, and may identify or determine an LVDD value appropriate for the characteristic of the volatile memory 230 based on a result of the test.

Referring to FIG. 7, according to various embodiments, in operation 701, the electronic device 201 may decrease a previously set LVDD by a designated first voltage (e.g., 10 mV). The designated first voltage may be set automatically by the processor 220, or may be set by a user.

According to various embodiments, in operation 703, the electronic device 201 may test the LVDD margin with respect to the LVDD obtained by decreasing the previously set LVDD by the designated first voltage. For example, in the case in which the LVDD obtained by decreasing the previously set LVDD by the designated first voltage is provided to the volatile memory 230, the electronic device 201 may identify whether the volatile memory 230 stably and normally operates.

According to various embodiments, in operation 705, based on the LVDD obtained by decreasing the previously set LVDD by the designated first voltage, the electronic device 201 may identify whether a test result is a test pass. For example, if the volatile memory 230 stably and normally operates at the corresponding LVDD, the test result may be a test pass.

According to various embodiments, in the case in which the test result is a test pass (Yes in operation 705), the electronic device 201 may set, as a new LVDD, the LVDD obtained by decreasing the previously set LVDD by the designated first voltage. In addition, the electronic device 201 may perform operations 701 to 705 again with respect to the newly set LVDD.

According to various embodiments, if the test result is not a test pass (No in operation 705), the electronic device 201 may decrease the previously set LVDD (e.g., the previously set LVDD before being decreased by the designated first voltage) by a designated second voltage (e.g., 1 mV) in operation 709. For example, the second voltage may be less than the first voltage.

According to various embodiments, in operation 711, the electronic device 201 may test an LVDD margin with respect to the LVDD obtained by decreasing the previously set LVDD by the designated second voltage. For example, in the case in which the LVDD obtained by decreasing the previously set LVDD by the designated second voltage is provided to the volatile memory 230, the electronic device 201 may identify whether the volatile memory 230 stably and normally operates.

According to various embodiments, in operation 713, the electronic device 201 may identify whether a test result is a test pass based on the LVDD obtained by decreasing the previously set LVDD by the designated second voltage.

According to various embodiments, in the case in which the test result is a test pass (Yes in operation 713), the electronic device 201 may set, as a new LVDD, the LVDD obtained by decreasing the previously set LVDD by the designated second voltage. In addition, the electronic device 201 may perform operations 709 to 713 again with respect to the newly set LVDD.

According to various embodiments, in the case in which the test result is not a test pass (No in operation 713), the electronic device 201 may identify or determine the previously set LVDD value (e.g., the previously set LVDD value before being decreased by the designated second voltage) as the LVDD value for the volatile memory 230 (or VDD2 voltage of the volatile memory 230) in operation 717. That is, the electronic device 201 may determine or identify the previously set LVDD value (e.g., the previously set LVDD value before being decreased by the designated second voltage) as an LVDD value appropriate for the characteristic of the volatile memory 230.

Figure 8:
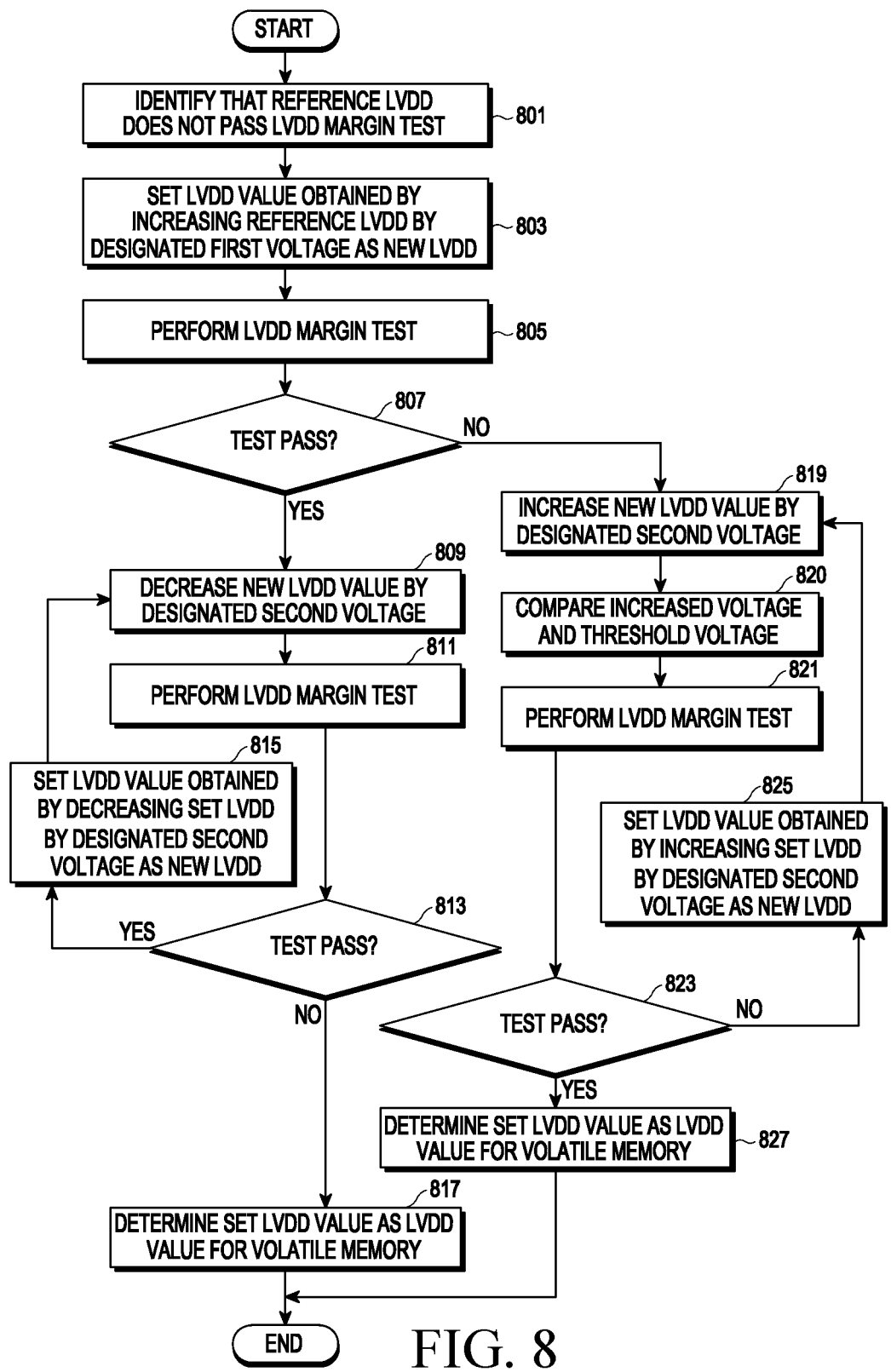
FIG. 8 is a flowchart illustrating an operation of identifying an LVDD value for a volatile memory by performing an LVDD margin test, performed by an electronic device according to various embodiments.

FIG. 8 is a flowchart illustrating an operation of identifying an LVDD value for a volatile memory by performing an LVDD margin test, performed by an electronic device according to various embodiments.

Referring to FIG. 8, according to various embodiments, in operation 801, the electronic device 201 may identify that a reference LVDD does not pass an LVDD margin test.

According to various embodiments, in operation 803, the electronic device 201 may set, as a new LVDD, an LVDD value obtained by increasing the reference LVDD by a designated first voltage (e.g., 10 mV).

According to various embodiments, in operation 805, the electronic device 201 may perform an LVDD margin test on the LVDD value obtained by increasing the reference LVDD by the designated first voltage (e.g., 10 mV). For example, in the case in which the LVDD obtained by increasing the reference LVDD by the designated first voltage is provided to the volatile memory 230, the electronic device 201 may identify whether the volatile memory 230 stably and normally operates.

According to various embodiments, in operation 807, based on the new LVDD obtained by increasing the previously set LVDD by the designated first voltage, the electronic device 201 may identify whether a test result is a test pass.

According to various embodiments, in the case in which the test result is a test pass (Yes in operation 807), the electronic device 201 may decrease the new LVDD value by a designated second voltage (e.g., 1 mV) in operation 809. For example, the second voltage may be less than the first voltage. According to various embodiments, in operation 811, the electronic device 201 may decrease the new LVDD value by the designated second voltage and may perform a margin test on the corresponding LVDD. According to various embodiments, in operation 813, based on the corresponding new LVDD obtained by decreasing the new LVDD value by the designated second voltage, the electronic device 201 may identify whether a test result is a test pass. According to various embodiments, in the case in which the test result is a test pass (Yes in operation 813), the electronic device 201 may set, as a new LVDD, the LVDD value obtained by decreasing the previously set LVDD by the designated second voltage in operation 815. Subsequently, the electronic device 201 may perform operations 809 to 813 with respect to the newly set LVDD. According to various embodiments, if the test result is not a test pass (No in operation 813), the electronic device 201 may determine (or identify) the set LVDD value (e.g., the LVDD value before being decreased by the second voltage) as an LVDD value for the volatile memory 230 in operation 817.

According to various embodiments, in the case in which the test result is not a test pass (No in operation 807), the electronic device 201 may increase the new LVDD value by the designated second voltage (e.g., 1 mV) in operation 819. According to various embodiments, in operation 820, the electronic device 201 may compare a voltage value (e.g., LVDD value +1 mV) obtained by increasing the new LVDD value by the second voltage and a threshold voltage. For example, in the case in which the voltage value obtained by increasing the new LVDD value by the second voltage is greater than the threshold value, the electronic device 201 may determine that the electronic device 201 is defective. In this instance, the electronic device 201 may not perform a margin test on the corresponding LVDD (e.g., the voltage value obtained by increasing the new LVDD value by the second voltage). According to various embodiments, in operation 821, the electronic device 201 may increase the new LVDD value by the designated second voltage, and may perform a margin test on the corresponding LVDD. In this instance, the voltage value obtained by increasing the new LVDD value by the second voltage may not be greater than the threshold voltage. According to various embodiments, in operation 823, based on the corresponding new LVDD obtained by increasing the new LVDD value by the designated second voltage, the electronic device 201 may identify whether a test result is a test pass. According to various embodiments, in the case in which the test result is not a test pass (No in operation 823), the electronic device 201 may set, as a new LVDD, the LVDD value obtained by increasing the set LVDD by the designated second voltage in operation 825. Subsequently, the electronic device 201 may perform operations 819 to 823 with respect to the newly set LVDD. According to various embodiments, if the test result is a test pass (Yes in operation 823), the electronic device 201 may determine (or identify) the set LVDD value (e.g., the LVDD value before being increased by the second voltage) as an LVDD value for the volatile memory 230 in operation 827.

Figure 9:
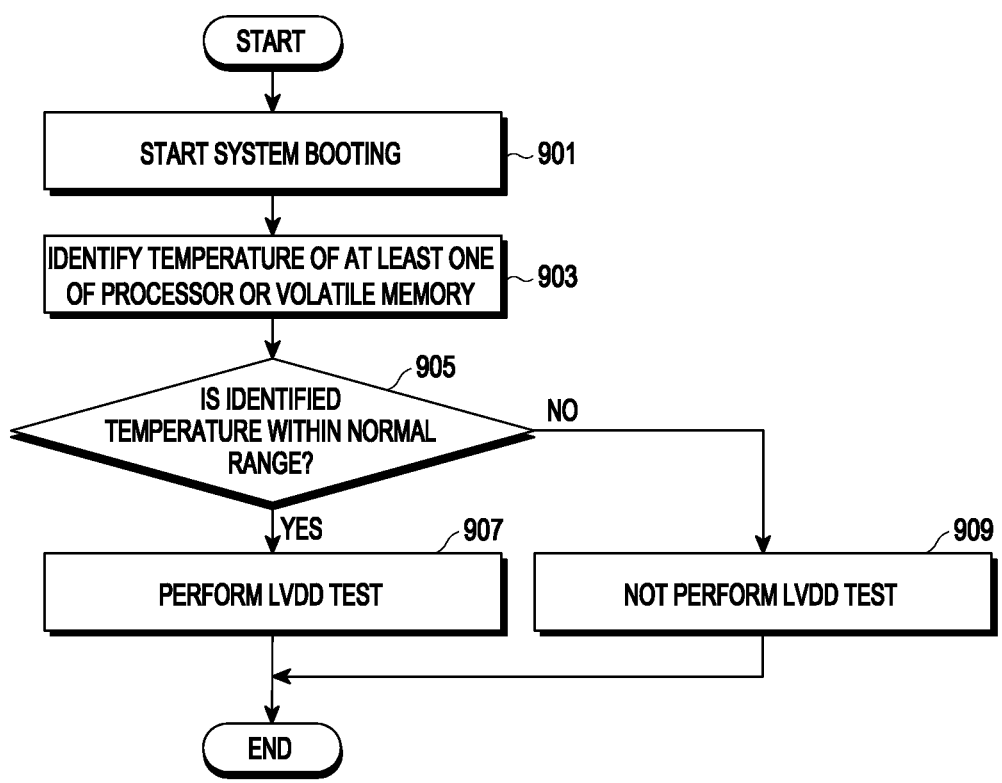
FIG. 9 is a flowchart illustrating an operation of performing an LVDD margin test based on the temperature of at least one of a processor or a volatile memory, performed by an electronic device according to various embodiments.

FIG. 9 is a flowchart illustrating an operation of performing an LVDD margin test based on the temperature of at least one of a processor or a volatile memory, performed by an electronic device according to various embodiments.

Referring to FIG. 9, according to various embodiments, in operation 901, the electronic device 201 may start system booting.

According to various embodiments, in operation 903, the electronic device 201 may identify the temperature of at least one of the processor 220 or the volatile memory 230. For example, the electronic device 201 may obtain the temperature value of the processor 220 from the processor 220, and may obtain the temperature value of the volatile memory 230 from the volatile memory 230. For example, the electronic device 201 may identify the temperature of at least one of the processor 220 or the volatile memory 230 via a temperature sensor included in the processor 220 and/or a separate temperature sensor (e.g., a temperature sensor included in the electronic device 201).

According to various embodiments, in operation 905, the electronic device 201 may identify whether the identified temperature is within a normal range. For example, the normal range may be a designated temperature range in which the processor 220 and the volatile memory 230 are capable of stably and normally operating. For example, the normal range may be set automatically by the processor 220, or may be set by a user.

According to various embodiments, if it is identified that the identified temperature is within the normal range (Yes in operation 905), the electronic device 201 may perform an LVDD margin test in operation 907.

According to various embodiments, if it is identified that the identified temperature is beyond the normal range (No in operation 905), the electronic device 201 may not perform an LVDD margin test in operation 909. An LVDD margin test result may differ depending on a temperature, and thus the electronic device 201 may test the margin of an LVDD if it is identified that the identified temperature is within the normal range.

Figure 10:
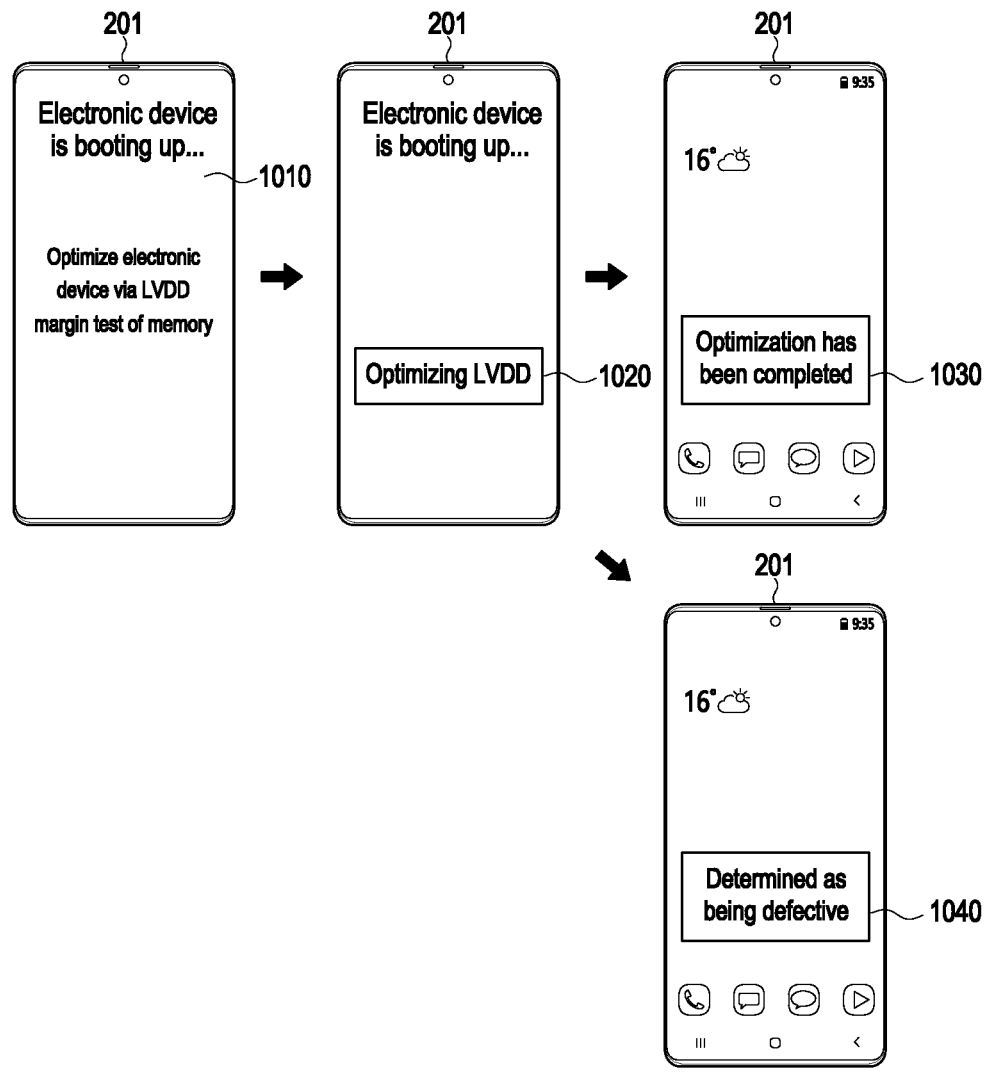
FIG. 10 shows diagrams illustrating an operation of adjusting a voltage for driving a volatile memory when an electronic device performs booting according to various embodiments.

FIG. 10 shows diagrams illustrating an operation of adjusting a voltage for driving a volatile memory when an electronic device performs booting according to various embodiments.

Referring to FIG. 10, according to various embodiments, when performing system booting, the electronic device 201 may perform an LVDD margin test and may adjust an LVDD value. For example, the electronic device 201 may display, on a display (e.g., the display 260 of FIG. 2), information 1010 related to an operation of adjusting the LVDD value before performing an LVDD margin test. In addition, the electronic device 201 may display information 1020 related to an operation of adjusting the LVDD value while performing an LVDD margin test.

According to various embodiments, upon completion of system booting, the electronic device 201 may display information 1030 indicating that adjustment and optimization of the LVDD value has been completed. Alternatively, before completion of system booting, the electronic device 201 may display the information 1030 indicating that adjustment or optimization of the LVDD value has been completed.

According to various embodiments, based on an LVDD margin test result, the electronic device 201 may determine whether the processor 220 and/or the volatile memory 230 is defective. Based on the LVDD margin test result, the electronic device 201 may display information 1040 indicating that the electronic device 201 is determined as being defective.

Figure 11:
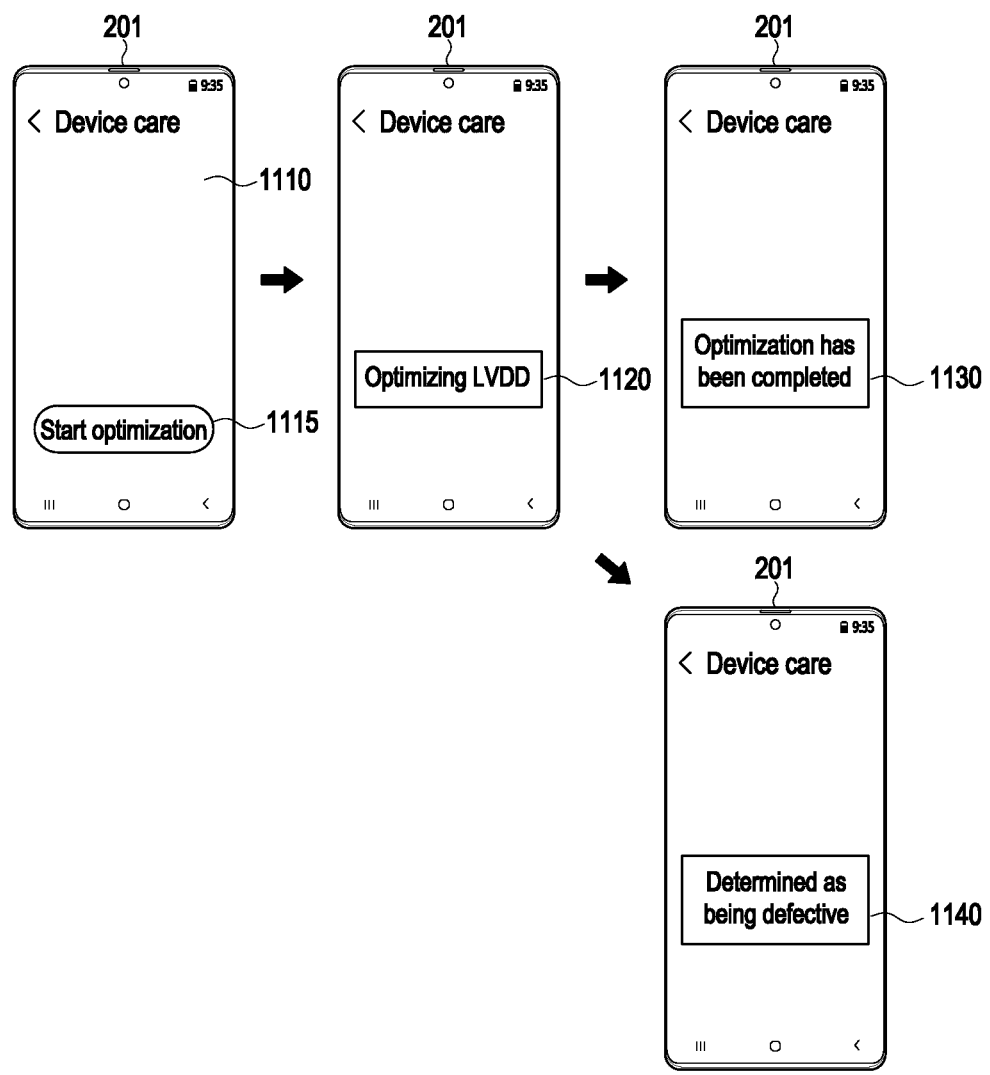
FIG. 11 shows diagrams illustrating an operation of adjusting a voltage for driving a volatile memory using an application, performed by an electronic device according to various embodiments.

FIG. 11 shows diagrams illustrating an operation of adjusting a voltage for driving a volatile memory using an application, performed by an electronic device according to various embodiments.

Referring to FIG. 11, according to various embodiments, the electronic device 201 may perform an LVDD margin test using an application, and may adjust an LVDD value. For example, the application may be an application that manages the electronic device 201. For example, the electronic device 201 may execute an application based on a user input, and may display an execution screen 1110 of the application. Based on a user input to an execution object 1115, the electronic device 201 may perform an LVDD margin test and may start an operation of adjusting an LVDD value. For example, based on the user input to the execution object 1115, the electronic device 201 may restart the system, may perform system booting, and may perform an LVDD margin test. Alternatively, based on the user input to the execution object 1115, the electronic device 201 may perform an LVDD margin test without restarting the system. For example, the electronic device 201 may display, on the execution screen 1110 of the application, information related to an operation of adjusting the LVDD value. The electronic device 201 may display information 1120 related to an operation of adjusting the LVDD value while performing an LVDD margin test.

According to various embodiments, upon completing the adjustment of the LVDD value, the electronic device 201 may display information 1130 indicating that the adjustment or optimization of the LVDD value has been completed.

According to various embodiments, based on an LVDD margin test result, the electronic device 201 may determine whether the processor 220 and/or the volatile memory 230 is defective. Based on the LVDD margin test result, the electronic device 201 may display information 1140 indicating that the electronic device 201 is determined as being defective.

According to an aspect of the disclosure, an electronic device includes: a power management circuit; a volatile memory; and a processor configured to: based on the electronic device starting system booting, identify whether the system booting is initial booting or whether a condition designated in the volatile memory is satisfied, based on identifying that the system booting is the initial booting or the condition is satisfied, identify a lower positive supply voltage (LVDD) value for the volatile memory by testing an LVDD margin for the volatile memory, and based on the LVDD value being less than a reference LVDD value for the volatile memory, drive the volatile memory using the LVDD value.

The processor may be further configured to, based on identifying that the system booting is not the initial booting and the condition is not satisfied, drive the volatile memory using the reference LVDD value.

The processor may be further configured to, based on identifying that the system booting is the initial booting and the LVDD value being not less than the reference LVDD value, determine that the electronic device is defective.

The processor may be further configured to, based on identifying that the system booting is not the initial booting, identify whether the LVDD value is less than a threshold voltage value, and based on identifying that the LVDD value is less than the threshold voltage value, drive the volatile memory using the LVDD value.

The processor may be further configured to, based on identifying that the system booting is not the initial booting and the LVDD value is not less than the threshold voltage value, determine that the electronic device is defective.

The electronic device may further include a display, and the processor may be further configured to display, on the display, a screen indicating the electronic device is defective.

The processor may be configured to identify the LVDD value based on whether the volatile memory operates normally after increasing or decreasing the reference LVDD value by a designated voltage value.

The processor may be configured to control the power management circuit to provide the LVDD value to the volatile memory.

The processor may be further configured to identify a temperature of at least one of the processor or the volatile memory, and identify the LVDD value for the volatile memory based on the temperature being within a designated temperature range.

The processor may be further configured to determine that the condition is satisfied based on a designated period of time elapsing after a previous identification of an LVDD value.

According to an aspect of the disclosure, a method of operating an electronic device, includes: based on the electronic device starting system booting, identifying whether the system booting is initial booting or whether a condition designated in a volatile memory included in the electronic device is satisfied; based on identifying that the system booting is the initial booting or the condition is satisfied, identifying a lower positive supply voltage (LVDD) value for the volatile memory by testing an LVDD margin for the volatile memory; and based on the LVDD value being less than a reference LVDD value for the volatile memory, driving the volatile memory using the LVDD value.

The method may further include, based on identifying that the system booting is not the initial booting and the condition is not satisfied, driving the volatile memory using the reference LVDD value.

The method may further include, based on identifying that the system booting is the initial booting and the LVDD value being not less than the reference LVDD value, determining that the electronic device is defective.

The method may further include, based on identifying that the system booting is not the initial booting, identifying the LVDD value and whether the LVDD value is less than a threshold voltage value; and based on identifying that the LVDD value when the LVDD value is less than the threshold voltage value, driving the volatile memory using the LVDD value.

The method may further include, based on identifying that the system booting is not the initial booting and the LVDD value is not less than the threshold voltage value, determining that the electronic device is defective.

The identifying the LVDD value may include identifying the LVDD value based on whether the volatile memory operates normally after increasing or decreasing the reference LVDD value by a designated voltage value.

The driving the volatile memory may include controlling a power management circuit included in the electronic device to provide the LVDD value to the volatile memory.

The identifying the LVDD value may include identifying a temperature of at least one of the volatile memory or a processor included in the electronic device; and identifying the LVDD value based on the temperature being within a designated temperature range.

The method may further include determining that the condition is satisfied based on a designated period of time elapsing after previous identification of an LVDD value.

According to an aspect of the disclosure, a non-transitory computer-readable recording medium stores a program that is executed by a processor of an electronic device to perform a method including: based on the electronic device starting system booting, identifying whether the system booting is initial booting or whether a condition designated in a volatile memory included in the electronic device is satisfied; based on identifying that the system booting is the initial booting or the condition is satisfied, identifying a lower positive supply voltage (LVDD) value for the volatile memory by testing an LVDD margin for the volatile memory; and based on the LVDD value being less than a reference LVDD value for the volatile memory, driving the volatile memory using the LVDD value.

What is claimed is:

1. An electronic device comprising:
a power management circuit;
a volatile memory; and
a processor configured to:
based on the electronic device starting system booting, identify whether the system booting is initial booting or whether a designated period of time elapses after a previous identification of a lower positive supply voltage (LVDD) value for the volatile memory,
based on identifying that the system booting is the initial booting or the designated period of time elapses after the previous identification of the LVDD value, identify the LVDD value for the volatile memory by testing an LVDD margin for the volatile memory, and
based on the LVDD value being less than a reference LVDD value for the volatile memory, drive the volatile memory using the LVDD value,
wherein the testing the LVDD margin for the volatile memory comprises:
changing a stored LVDD value by a voltage increment to obtain a candidate LVDD value,
determining whether the volatile memory operates normally by applying the candidate LVDD value to the volatile memory,
based on determining that the volatile memory operates normally, identifying the candidate LVDD value as the LVDD value, and
based on the candidate LVDD value exceeding the reference LVDD value and identifying that the system booting is in the initial booting, determining that the volatile memory is defective and ending the testing of the LVDD margin, and
wherein the reference LVDD value is a predetermined value set based on a design or manufacturing of the electronic device.

2. The electronic device of claim 1, wherein the processor is further configured to:
based on identifying that the system booting is not the initial booting and the designated period of time does not elapse after the previous identification of the LVDD value, drive the volatile memory using the reference LVDD value.

3. The electronic device of claim 1, wherein the processor is further configured to:
based on identifying that the system booting is not the initial booting, identify whether the LVDD value is less than a threshold voltage value, and based on identifying that the LVDD value is less than the threshold voltage value, drive the volatile memory using the LVDD value.

4. The electronic device of claim 3, wherein the processor is further configured to:
based on identifying that the system booting is not the initial booting and the LVDD value is not less than the threshold voltage value, determine that the electronic device is defective.

5. The electronic device of claim 4, further comprising a display,
wherein the processor is further configured to:
display, on the display, a screen indicating the electronic device is defective.

6. The electronic device of claim 1, wherein the processor is further configured to:
identify the LVDD value based on whether the volatile memory operates normally after increasing or decreasing the reference LVDD value by a designated voltage value.

7. The electronic device of claim 1, wherein the processor is configured to:
control the power management circuit to provide the LVDD value to the volatile memory.

8. The electronic device of claim 1, wherein the processor is further configured to:
identify a temperature of at least one of the processor or the volatile memory, and
identify the LVDD value for the volatile memory based on the temperature being within a designated temperature range.

9. A method of operating an electronic device, the method comprising:
based on the electronic device starting system booting, identifying whether the system booting is initial booting or whether a designated period of time elapses after a previous identification of a lower positive supply voltage (LVDD) value for a volatile memory;
based on identifying that the system booting is the initial booting or the designated period of time elapses after the previous identification of the LVDD value, identifying the LVDD value for the volatile memory by testing an LVDD margin for the volatile memory;
based on the LVDD value being less than a reference LVDD value for the volatile memory, driving the volatile memory using the LVDD value,
wherein the testing the LVDD margin for the volatile memory comprises:
changing a stored LVDD value by a voltage increment to obtain a candidate LVDD value,
determining whether the volatile memory operates normally by applying the candidate LVDD value to the volatile memory,
based on determining that the volatile memory operates normally, identifying the candidate LVDD value as the LVDD value, and
based on the candidate LVDD value exceeding the reference LVDD value and identifying that the system booting is in the initial booting, determining that the volatile memory is defective and ending the testing of the LVDD margin, and
wherein the reference LVDD value is a predetermined value set based on a design or manufacturing of the electronic device.

10. The method of claim 9, further comprising, based on identifying that the system booting is not the initial booting and the designated period of time does not elapse after the previous identification of the LVDD value, driving the volatile memory using the reference LVDD value.

11. The method of claim 9, further comprising, based on identifying that the system booting is not the initial booting, identifying the LVDD value and whether the LVDD value is less than a threshold voltage value; and
based on identifying that the LVDD value when the LVDD value is less than the threshold voltage value, driving the volatile memory using the LVDD value.

12. The method of claim 11, further comprising, based on identifying that the system booting is not the initial booting and the LVDD value is not less than the threshold voltage value, determining that the electronic device is defective.

13. The method of claim 9, wherein the identifying the LVDD value comprises identifying the LVDD value based on whether the volatile memory operates normally after increasing or decreasing the reference LVDD value by a designated voltage value.

14. The method of claim 9, wherein the driving the volatile memory comprises controlling a power management circuit included in the electronic device to provide the LVDD value to the volatile memory.

15. The method of claim 9, wherein the identifying the LVDD value comprises identifying a temperature of at least one of the volatile memory or a processor included in the electronic device; and
identifying the LVDD value based on the temperature being within a designated temperature range.

16. A non-transitory computer-readable recording medium storing a program that is executed by a processor of an electronic device to perform a method comprising:
based on the electronic device starting system booting, identifying whether the system booting is initial booting or whether a designated period of time elapses after a previous identification of a lower positive supply voltage (LVDD) value for a volatile memory;
based on identifying that the system booting is the initial booting or the designated period of time elapses after the previous identification of the LVDD value, identifying the LVDD value for the volatile memory by testing an LVDD margin for the volatile memory; and
based on the LVDD value being less than a reference LVDD value for the volatile memory, driving the volatile memory using the LVDD value,
wherein the testing the LVDD margin for the volatile memory comprises:
changing a stored LVDD value by a voltage increment to obtain a candidate LVDD value,
determining whether the volatile memory operates normally by applying the candidate LVDD value to the volatile memory,
based on determining that the volatile memory operates normally, identifying the candidate LVDD value as the LVDD value, and
based on the candidate LVDD value exceeding the reference LVDD value and identifying that the system booting is in the initial booting, determining that the volatile memory is defective and ending the testing of the LVDD margin, and
wherein the reference LVDD value is a predetermined value set based on a design or manufacturing of the electronic device.

* * * * *